(12) United States Patent
Inoue et al.

(10) Patent No.: US 12,170,514 B2
(45) Date of Patent: Dec. 17, 2024

(54) RESONATOR AND RESONANCE DEVICE INCLUDING SAME

(71) Applicant: Murata Manufacturing Co., Ltd., Nagaokakyo (JP)

(72) Inventors: Yoshihisa Inoue, Nagaokakyo (JP); Ryota Kawai, Nagaokakyo (JP); Yuichi Goto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 870 days.

(21) Appl. No.: 17/169,942

(22) Filed: Feb. 8, 2021

(65) Prior Publication Data

US 2021/0167754 A1 Jun. 3, 2021

Related U.S. Application Data

(63) Continuation of application No. PCT/JP2019/017267, filed on Apr. 23, 2019.

(30) Foreign Application Priority Data

Sep. 3, 2018 (JP) ................... 2018-164286

(51) Int. Cl.
*H03H 9/24* (2006.01)
*B81B 7/00* (2006.01)
(Continued)

(52) U.S. Cl.
CPC ......... *H03H 9/2457* (2013.01); *B81B 7/0038* (2013.01); *H03H 9/0595* (2013.01);
(Continued)

(58) Field of Classification Search
CPC .. H03H 9/2457; H03H 9/0595; H03H 9/1057; H03H 9/2489; B81B 7/0038;
(Continued)

(56) References Cited

U.S. PATENT DOCUMENTS 7,673,512 B2 * 3/2010 Takahashi .......... G01C 19/5607
73/504.16
10,673,403 B2 6/2020 Hirota et al.
(Continued)

FOREIGN PATENT DOCUMENTS

| CN | 107431476 A | 12/2017 |
| JP | 2010147953 A | 7/2010 |

(Continued)

OTHER PUBLICATIONS

International Search Report Issued for PCT/JP2019/017267, date of mailing Jul. 16, 2019.
(Continued)

*Primary Examiner* — Shawki S Ismail
*Assistant Examiner* — Lisa N Homza
(74) *Attorney, Agent, or Firm* — ArentFox Schiff LLP

(57) ABSTRACT

A resonator is provided that includes a base; at least three vibrating arms that include a piezoelectric film, an upper electrode, and a lower electrode; a frame; and a holding arm. Each vibrating arm includes an arm portion and a tip portion. The holding arm includes a holding side arm that extends parallel to the outer vibrating arm. A release width between the tip portion of the outer vibrating arm and the frame is larger than a release width between the holding side arm and the frame or a release width between the arm portion of the outer vibrating arm and the holding side arm.

18 Claims, 6 Drawing Sheets

(51) Int. Cl.
*H03H 9/05* (2006.01)
*H03H 9/10* (2006.01)
(52) U.S. Cl.
CPC ... *H03H 9/1057* (2013.01); *B81B 2201/0271* (2013.01); *B81B 2203/0118* (2013.01)
(58) Field of Classification Search
CPC .... B81B 2201/0271; B81B 2203/0118; H02N 1/006; H02N 2/00
See application file for complete search history.

(56) References Cited

U.S. PATENT DOCUMENTS

| | | |
|---|---|---|
| 10,749,496 B2 | 8/2020 | Yoshii et al. |
| 10,790,800 B2 | 9/2020 | Hirota et al. |
| 2010/0156246 A1 | 6/2010 | Iwai |
| 2018/0034441 A1 | 2/2018 | Hirota et al. |
| 2018/0048288 A1 | 2/2018 | Hirota et al. |
| 2018/0205363 A1* | 7/2018 | Hirota ................. H03H 9/0595 |
| 2019/0074812 A1* | 3/2019 | Inoue .................. B81B 3/0072 |
| 2019/0097600 A1* | 3/2019 | Yoshii .................. H03H 9/1057 |
| 2020/0136587 A1* | 4/2020 | Inoue ................. H03H 9/02338 |
| 2020/0204155 A1* | 6/2020 | Inoue ...................... H03H 9/10 |
| 2020/0212877 A1* | 7/2020 | Inoue .................. H03H 9/1057 |
| 2020/0290865 A1* | 9/2020 | Umeda ................ H03H 3/0072 |
| 2021/0083647 A1* | 3/2021 | Inoue ................... B81B 7/0038 |
| 2021/0184651 A1* | 6/2021 | Kawai ................ H03H 9/02448 |
| 2021/0194454 A1* | 6/2021 | Umeda ................ H03H 9/2489 |
| 2021/0203304 A1* | 7/2021 | Inoue .................. H10N 30/853 |
| 2022/0029598 A1* | 1/2022 | Inoue ................. H03H 9/02448 |
| 2023/0015447 A1* | 1/2023 | Kawai .................. H03H 9/1057 |
| 2023/0018209 A1* | 1/2023 | Higuchi ................... H03H 9/17 |

FOREIGN PATENT DOCUMENTS

| | | |
|---|---|---|
| WO | 2016175218 A1 | 11/2016 |
| WO | 2017208568 A | 11/2017 |

OTHER PUBLICATIONS

Written Opinion of the International Searching Authority issued for PCT/JP2019/017267, date of mailing Jul. 16, 2019.

* cited by examiner

RESONATOR AND RESONANCE DEVICE INCLUDING SAME

CROSS REFERENCE TO RELATED APPLICATIONS

The present application is a continuation of PCT/JP2019/017267 filed Apr. 23, 2019, which claims priority to Japanese Patent Application No. 2018-164286, filed Sep. 3, 2018, the entire contents of each of which are incorporated herein by reference.

TECHNICAL FIELD

The present invention relates to a resonator and to a resonance device that includes a resonator.

BACKGROUND

In general, resonance devices, which are types of microelectromechanical system (MEMS), are currently incorporated into electronic devices such as smartphones as a timing device, for example. This type of resonance device, for example, includes a bottom cover, a top cover that forms a cavity together with the bottom cover, and a resonator that is arranged inside the cavity between the bottom cover and the top cover. The resonator includes, for example, a piezoelectric film, an upper electrode and a lower electrode provided with the piezoelectric film interposed therebetween, and an insulating film provided between the layers or on the surface of the resonator.

As an example of a specific configuration of such a resonator, for example, Patent Document 1 (identified below) discloses a resonator that includes a first electrode and a second electrode, a piezoelectric film provided between the first electrode and the second electrode, a protective film composed of an insulator provided on the first electrode, and a conductive film composed of a conductor provided on the protective film. The conductive film is electrically connected to either one of the first electrode and the second electrode.

Patent Document 1: International Publication No. 2017/208568.

In resonators of the related art, it is known that when an insulator or conductor provided on a surface or between layers becomes charged due to ion beam sputtering or the pyroelectric effect, an attractive or repulsive force may act on the resonator due to the Coulomb force and consequently the resonant frequency of the resonator may vary. In the case of a resonator having a vibrating arm that extends from a base thereof and vibrates in a bending vibration mode, the effect of such a Coulomb force is most pronounced at the tip of the vibrating arm where the vibrating arm is most easily displaced and the range of motion is largest.

Regarding this point, the charge with which the conductive film is charged in the resonator disclosed in Patent Document 1 can be released to some extent, but the area where the conductive film is provided may be limited, and the effect of the Coulomb force received by the vibrating arm may not be sufficiently eliminated.

Increasing the width of the gap formed around the periphery of the vibrating arm can reduce the effect of the Coulomb force received by the vibrating arm. However, if the gap is increased while maintaining the dimensions of the base and vibrating arm, the dimensions of the resonator will likely increase. If the dimensions of the base or vibrating arm are reduced in order to increase the size of this gap, there is also a risk of the vibration characteristics of the resonator being degraded. In particular, if the dimensions of the base are reduced, degradation of vibration characteristics, such as the driving voltage dependence of the frequency, is a concern.

SUMMARY OF THE INVENTION

The exemplary embodiments of the present invention are provided in light of the above-described circumstances. Thus, it is an object thereof to provide a resonator that can be reduced in size while suppressing variations in the resonant frequency and to provide a resonance device that includes the resonator.

An exemplary aspect provides a resonator that includes a base; at least three vibrating arms that include a piezoelectric film, an upper electrode and a lower electrode provided so as to face each other with the piezoelectric film interposed therebetween, first ends of the vibrating arms being fixed ends connected to a front end of the base and second ends of the vibrating arms being open ends provided so as to be spaced away from the front end. Moreover, a frame is provided for holding the base; and a holding arm connects the base to the frame. Each vibrating arm among the at least three vibrating arms includes an arm portion that extends from the front end of the base and a tip that is connected to the arm portion. The holding arm includes a holding side arm that extends parallel to an outer vibrating arm, which is arranged on the outside among the at least three vibrating arms, between the outer vibrating arm and the frame. A release width between the tip of the outer vibrating arm and the frame is larger than a release width between the holding side arm and the frame or a release width between the arm portion of the outer vibrating arm and the holding side arm.

According to the exemplary embodiments of the present invention, a resonator is provided with reduced size while suppressing variations in the resonant frequency. Moreover, a resonance device is provided that includes the resonator.

DETAILED DESCRIPTION OF EMBODIMENTS

Figure 1:
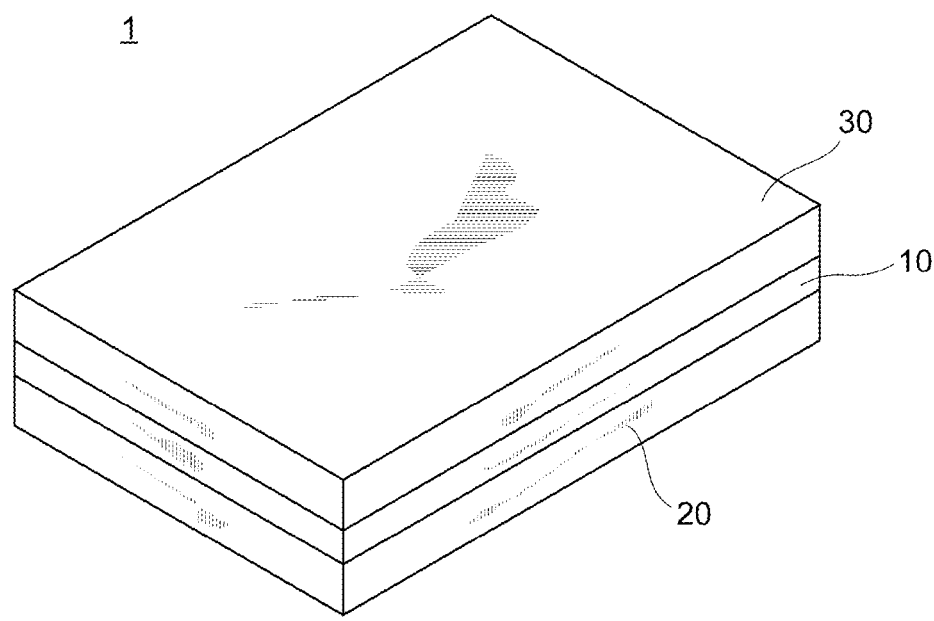
FIG. 1 is a perspective view schematically illustrating the exterior of a resonance device according to a first exemplary embodiment.
Figure 1:
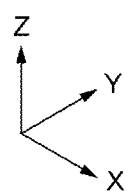

Hereafter, exemplary embodiments of the present invention will be described while referring to the drawings. In the following description of the drawings, identical or similar constituent elements are denoted by identical or similar reference symbols. The drawings are representative, the dimensions and shapes of the individual parts are schematically illustrated, and the technical scope of the present invention should not be interpreted as being limited to that of the embodiments.

First Exemplary Embodiment

Figure 2:
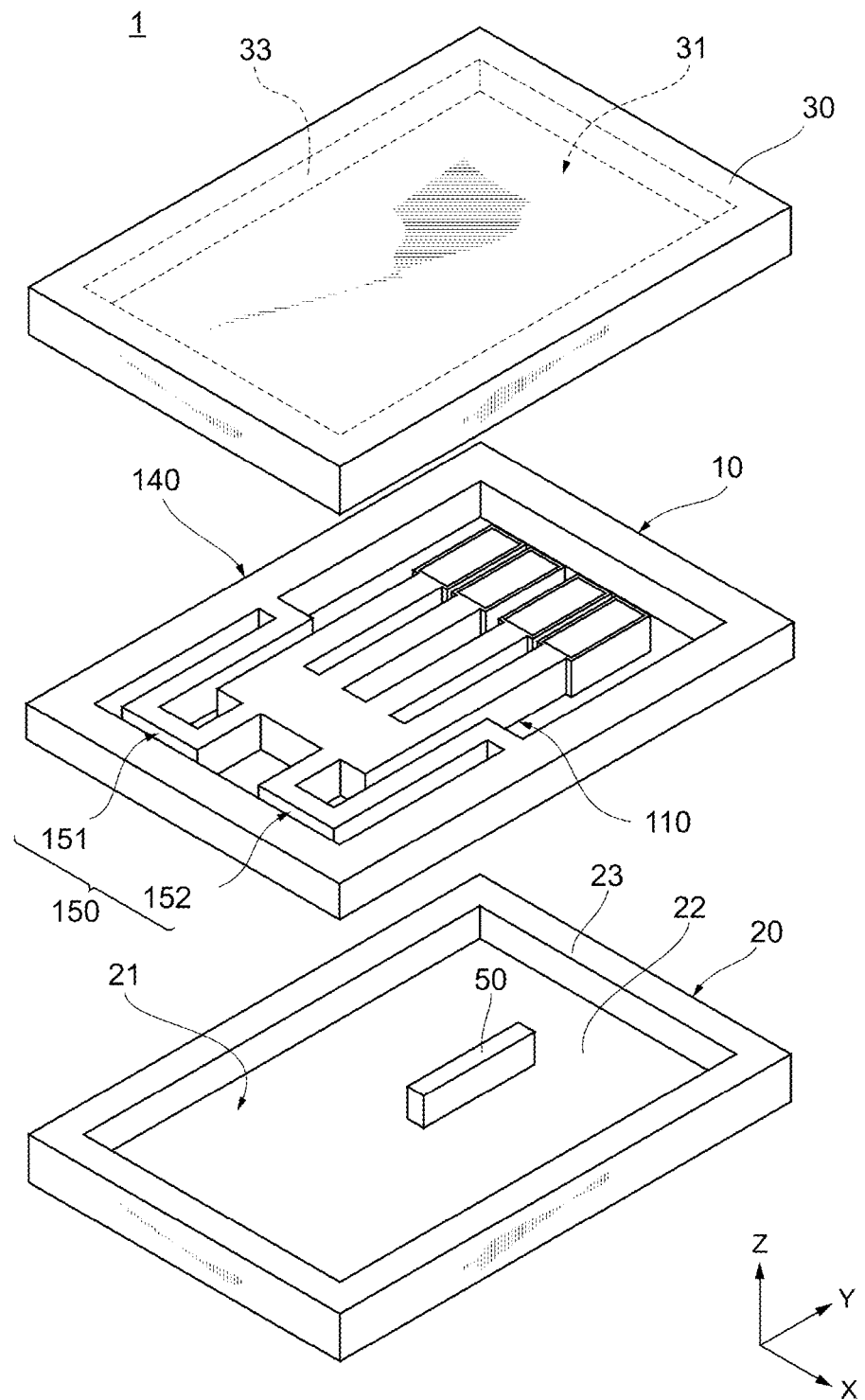
FIG. 2 is an exploded perspective view schematically illustrating the structure of the resonance device according to the first exemplary embodiment.

First, the configuration of a resonance device 1 according to a first embodiment will be described while referring to FIGS. 1 and 2. FIG. 1 is a perspective view schematically illustrating the exterior of the resonance device according to the first embodiment. FIG. 2 is an exploded perspective view schematically illustrating the structure of the resonance device according to the first embodiment.

(Resonance Device 1)

The resonance device 1 includes a resonator 10 and a bottom cover 20 and a top cover 30 provided so as to face each other with the resonator 10 interposed therebetween. The bottom cover 20, the resonator 10, and the top cover 30 are stacked in this order in a Z-axis direction. The resonator 10 and the bottom cover 20 are bonded to each other and the resonator 10 and the top cover 30 are bonded to each other. A vibration space of the resonator 10 is formed between the bottom cover 20 and the top cover 30, which are bonded to each other with the resonator 10 interposed therebetween. In exemplary aspects, the resonator 10, the bottom cover 20, and the top cover 30 are formed using substrates that can be processed using microfabrication techniques, such as semiconductor substrates, glass substrates, and organic substrates.

Hereafter, the configuration of each part of the resonance device 1 will be described. For purposes of this disclosure, it is noted that in the following description, the side of the resonance device 1 where the top cover 30 is provided is referred to as "top" (or "front") and the side of the resonance device 1 where the bottom cover 20 is provided is referred to as "bottom" (or "rear").

In the exemplary aspect, the resonator 10 is a MEMS resonator manufactured using MEMS techniques. The resonator 10 includes a vibrating portion 110, a holding portion 140 (i.e., a frame), and a holding arm 150. The vibrating portion 110 is held in the vibration space. The vibration mode of the vibrating portion 110 is not limited and is, for example, an out-of-plane bending vibration mode with respect to the XY plane, but in alternative aspects may instead be an in-plane bending vibration mode with respect to the XY plane. The holding portion 140 is, for example, provided so as to have a rectangular frame shape so as surround the vibrating portion 110. The holding arm 150 connects the vibrating portion 110 and the holding portion 140 to each other.

As further shown, the bottom cover 20 includes a rectangular flat plate shaped bottom plate 22, which is provided along the XY plane, and a side wall 23 that extends from the periphery of the bottom plate 22 in the Z-axis direction. The side wall 23 is bonded to the holding portion 140 of the resonator 10. A recess 21, which is formed by the front surface of the bottom plate 22 and the inner surface of the side wall 23, is formed on the surface of the bottom cover 20 that faces the vibrating portion 110 of the resonator 10. The recess 21 is a rectangular parallelepiped shaped opening that opens upwardly and forms part of the vibration space of the resonator 10. On the inner surface of the bottom cover 20, a protrusion 50, which protrudes into the vibration space, is formed on the front surface of the bottom plate 22.

Apart from the protrusion 50, the structure of the top cover 30 is symmetrical to the structure of the bottom cover 20 with respect to the resonator 10. In other words, the top cover 30 includes a rectangular flat plate shaped bottom plate 32 provided along the XY plane and a side wall 33 that extends from the periphery of the bottom plate 32 in the Z-axis direction, and the side wall 33 is bonded to the holding portion 140 of the resonator 10. Moreover, a recess 31 is formed in the top cover 30 on a surface that faces the vibrating portion 110 of the resonator 10. The recess 31 is a rectangular parallelepiped shaped opening that opens downward and forms part of the vibration space of the resonator 10.

The structure of the bottom cover 20 and the structure of the top cover 30 is not limited to this example, and the structures may instead be non-symmetrical with each other, for example. For example, one out of the bottom cover 20 and the top cover 30 may have a dome-like shape in exemplary aspects. The shapes of the recess 21 of the bottom cover 20 and the recess 31 of the top cover 30 may be different from each other, and for example, the depths of the recess 21 and the recess 31 may be different from each other.

(Resonator 10)

Figure 3:
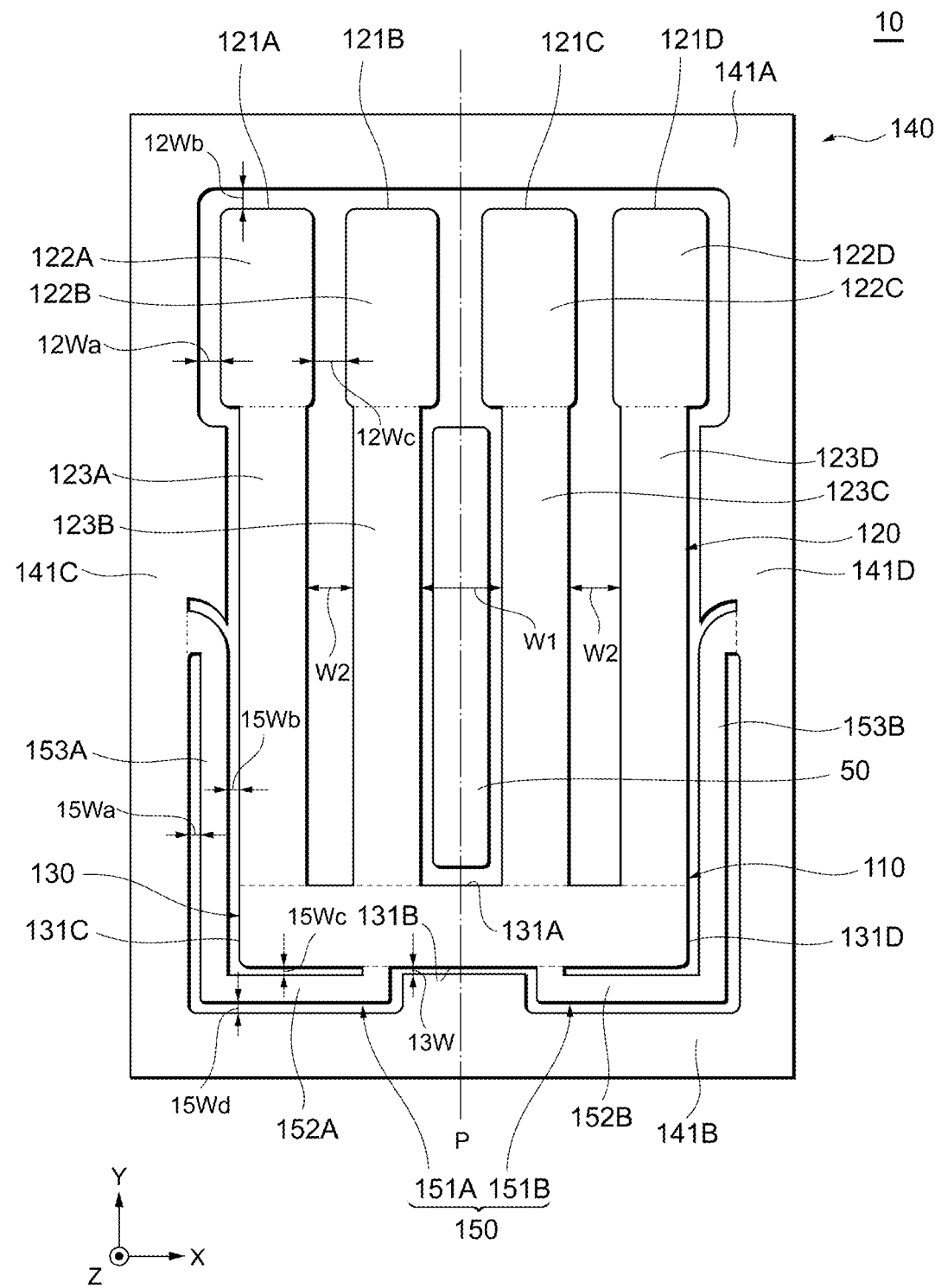
FIG. 3 is a plan view schematically illustrating the structure of a resonator according to the first exemplary embodiment.

Next, the configurations of the vibrating portion 110, the holding portion 140, and the holding arm 150 of the resonator 10 according to the embodiment will be described in detail while referring to FIG. 3. FIG. 3 is a plan view schematically illustrating the structure of the resonator according to the first embodiment of the present invention.

(Vibrating Portion 110)

The vibrating portion 110 is provided inside the holding portion 140 (i.e., the frame) in a plan view from the top cover 30 side. A space is formed between the vibrating portion 110 and the holding portion 140 with a predetermined spacing. The vibrating portion 110 includes an excitation portion 120 that includes four vibrating arms 121A, 121B, 121C, and 121D and a base portion 130 (or simply a "base") that is connected to the excitation portion 120. Note that the number of vibrating arms is not limited to four and an arbitrary number of vibrating arms of three or more may be provided in alternative aspects. In this embodiment, the excitation portion 120 and the base portion 130 are formed so as to be integrated with each other.

(Vibrating Arms 121A to 121D)

The vibrating arms 121A, 121B, 121C, and 121D extend in the Y-axis direction and are provided parallel to each other in this order with a prescribed spacing therebetween in the X-axis direction. One end of the vibrating arm 121A is a fixed end that is connected to a front end portion 131A (i.e., the front end) of the base portion 130, which is described later, and the other end of the vibrating arm 121A is an open end that is provided so as to be spaced away from the front end portion 131A of the base portion 130. The vibrating arm 121A includes a tip portion 122A (or simply a "tip") that is formed at the open end side and an arm portion 123A that extends from the fixed end and is connected to the tip portion 122A. Similarly, the vibrating arms 121B, 121C, and 121D respectively include tip portions 122B, 122C, and 122D and arm portions 123B, 123C, and 123D. The arm portions 123A to 123D each have, for example, a width of around 50 μm in the X-axis direction and a length of around 450 μm in the Y-axis direction.

Among the four vibrating arms, the vibrating arms 121A and 121D are considered outer vibrating arms that are arranged on the outside in the X-axis direction and the vibrating arms 121B and 121C are considered inner vibrating arms that are arranged on the inside in the X-axis direction. As an example, a width (hereafter referred to as "release width") W1 of a gap formed between the arm portions 123B and 123C of the inner vibrating arms 121B and 121C is set so as to be larger than a release width W2 between the arm portions 123A and 123B of the outer vibrating arm 121A and the inner vibrating arm 121B, which are adjacent to each other in the X-axis direction, and so as to be larger than a release width W2 between the arm portion 123D and 123C of the outer vibrating arm 121D and the inner vibrating arm 121C, which are adjacent to each other in the X-axis direction. Based on this configuration, the vibration characteristics and durability are improved by setting the release width W1 to be larger than the release width W2 in this way. The numerical values of the release widths W1 and W2 are not restricted, and for example, the release width W1 is around 25 μm and the release width W2 is around 10 μm. Note that the release width W1 between the arm portions of the inner vibrating arms and the release width W2 between the arm portions of an inner vibrating arm and an outer vibrating arm are not limited to being configured in the manner illustrated in FIG. 3, and alternatively, the release width W1 may be set so as to be smaller than the release width W2 or both widths may be set to be equal to each other.

Moreover, in the exemplary aspect, the width of each of the tip portions 122A to 122D in the X-axis direction is larger than the width of each of the arm portions 123A to 123D in the X-axis direction. Therefore, the weight per unit length in the Y-axis direction (hereafter, also simply referred to as "weight") of each of the tip portions 122A to 122D is larger than the weight of each of the arm portions 123A to 123D. In other words, the tip portions 122A to 122D correspond to mass-loaded portions for increasing the weights of the vibrating arms 121A to 121D. Thus, the vibration characteristics can be improved while reducing the size of the vibrating portion 110. In addition, mass-adding films may be provided on the surfaces of the tip portions 122A to 122D from the viewpoint of increasing the weights of the tip portions 122A to 122D. In an exemplary aspect, such mass-adding films can be used as frequency-adjusting films for adjusting the resonant frequencies of the vibrating arms 121A to 121D by shaving away parts of the mass-adding films.

In a plan view from the top cover 30 side, the protrusion 50, which protrudes from the bottom cover 20, is formed between the arm portions 123B and 123C of the inner vibrating arms 121B and 121C. The protrusion 50 extends in the Y-axis direction that is parallel to the arm portions 123B and 123C. In an exemplary aspect, the length of the protrusion 50 in the Y-axis direction is around 240 μm and the length of the protrusion 50 in the X-axis direction is around 15 μm. Moreover, bending of the bottom cover 20 is suppressed by formation of the protrusion 50.

(Base Portion 130)

As illustrated in FIG. 3, in a plan view from the top cover 30 side, the base portion 130 (or base) includes the front end portion 131A, a rear end portion 131B, a left end portion 131C, and a right end portion 131D. The front end portion 131A, the rear end portion 131B, the left end portion 131C, and the right end portion 131D are parts of the periphery of the base portion 130. Specifically, the front end portion 131A is an end portion that extends in the X-axis direction on the side near the vibrating arms 121A to 121D. The rear end portion 131B is an end portion that extends in the X-axis direction on the opposite side from the vibrating arms 121A to 121D. The left end portion 131C is an end portion that extends in the Y-axis direction on the side near the vibrating arm 121A when looking from the vibrating arm 121D. The right end portion 131D is an end portion that extends in the Y-axis direction on the side near the vibrating arm 121D when looking from the vibrating arm 121A.

The two ends of the left end portion 131C connect one end of the front end portion 131A and one end of the rear end portion 131B to each other. The two ends of the right end portion 131D connect the other end of the front end portion 131A and the other end of the rear end portion 131B to each other. The front end portion 131A and the rear end portion 131B face each other in the Y-axis direction. The left end portion 131C and the right end portion 131D face each other in the X-axis direction. As further shown, the vibrating arms 121A to 121D are connected to and extend from the front end portion 131A.

In a plan view from the top cover 30 side, the shape of the base portion 130 is a substantially rectangular shape with the front end portion 131A and the rear end portion 131B forming the long sides and the left end portion 131C and the right end portion 131D forming the short sides. The base portion 130 is formed so as to substantially have planar symmetry with respect to a virtual plane P defined along a vertical bisector of the front end portion 131A and the rear end portion 131B. Note that the base portion 130 is not limited to having a rectangular shape as illustrated in FIG. 3 and may instead have another shape that substantially has planar symmetry with respect to the virtual plane P in alternative aspects. For example, the shape of the base portion 130 may be a trapezoid, with one of the front end portion 131A and the rear end portion 131B being longer than the other. Furthermore, at least one out of the front end portion 131A, the rear end portion 131B, the left end portion 131C, and the right end portion 131D may be bent or curved.

The virtual plane P corresponds to a plane of symmetry of the entire vibrating portion 110. Therefore, the virtual plane P is a plane that passes through the middle of the vibrating arms 121A to 121D in the X-axis direction and is located between the inner vibrating arms 121B and 121C. Specifically, the outer vibrating arm 121A and the inner vibrating arm 121B, which are adjacent to each other, are formed so as to be symmetrical with the outer vibrating arm 121D and the inner vibrating arm 121C, which are adjacent to each other, with the virtual plane P therebetween.

A base portion length of the base portion 130, which is the maximum distance between the front end portion 131A and the rear end portion 131B in the Y-axis direction, is around 40 μm, for example. Furthermore, a base portion width, which is the maximum distance between the left end portion 131C and the right end portion 131D in the X-axis direction, is around 300 μm, for example. In the example configuration illustrated in FIG. 3, the base portion length corresponds to the length of the left end portion 131C or the right end portion 131D and the base portion width corresponds to the length of the front end portion 131A or the rear end portion 131B.

(Holding Portion 140)

The holding portion 140 (or frame) is a part for holding the vibrating portion 110 in the vibration space formed by the bottom cover 20 and the top cover 30 and, for example, surrounds the vibrating portion 110. As illustrated in FIG. 3, the holding portion 140 includes a front frame 141A, a rear frame 141B, a left frame 141C, and a right frame 141D in a plan view from the top cover 30 side. The front frame 141A, the rear frame 141B, the left frame 141C, and the right frame 141D each form part of a substantially rectangular frame that surrounds the vibrating portion 110. Specifically, the front frame 141A is the part that extends in the X-axis direction on the side near the excitation portion 120 when looking from the base portion 130. The rear frame 141B is the part that extends in the X-axis direction on the side near the base portion 130 when looking from excitation portion 120. The left frame 141C is the part that extends in the Y-axis direction on the side near the vibrating arm 121A when looking from the vibrating arm 121D. The right frame 141D is the part that extends in the Y-axis direction on the side near the vibrating arm 121D when looking from the vibrating arm 121A. The holding portion 140 is formed so as to have planar symmetry with respect to the virtual plane P.

The two ends of the left frame 141C are respectively connected to one end of the front frame 141A and one end of the rear frame 141B. The two ends of the right frame 141D are respectively connected to the other end of the front frame 141A and the other end of the rear frame 141B. The front frame 141A and the rear frame 141B face each other in the Y-axis direction with the vibrating portion 110 interposed therebetween. The left frame 141C and the right frame 141D face each other in the X-axis direction with the vibrating portion 110 interposed therebetween. In alternative aspect, it is noted that it is sufficient that the holding portion 140 be provided along at least part of the periphery of the vibrating portion 110 and the holding portion 140 is not limited to having a continuous peripheral frame shape as shown in the exemplary embodiment.

(Holding Arm 150)

As further shown, the holding arm 150 is provided inside the holding portion 140 and connects the base portion 130 and the holding portion 140 to each other. As illustrated in FIG. 3, the holding arm 150 includes a left holding arm 151A and a right holding arm 151B in a plan view from the top cover 30 side. The left holding arm 151A connects the rear end portion 131B of the base portion 130 and the left frame 141C of the holding portion 140 to each other. The right holding arm 151B connects the rear end portion 131B of the base portion 130 and the right frame 141D of the holding portion 140. The left holding arm 151A includes a holding rear arm 152A and a holding side arm 153A and the right holding arm 151B includes a holding rear arm 152B and a holding side arm 153B. The holding arm 150 is formed so as to have planar symmetry with respect to the virtual plane P.

The holding rear arms 152A and 152B extend from the rear end portion 131B of the base portion 130 between the rear end portion 131B of the base portion 130 and the holding portion 140. Specifically, the holding rear arm 152A extends from the rear end portion 131B of the base portion 130 toward the rear frame 141B, bends, and then extends toward the left frame 141C. The holding rear arm 152B extends from the rear end portion 131B of the base portion 130 toward the rear frame 141B, bends, and then extends toward the right frame 141D.

The holding side arm 153A extends parallel to the outer vibrating arm 121A between the outer vibrating arm 121A and the holding portion 140. The holding side arm 153B extends parallel to the outer vibrating arm 121D between the outer vibrating arm 121D and the holding portion 140. Specifically, the holding side arm 153A extends from the end portion of the holding rear arm 152A on the side near the left frame 141C toward the front frame 141A, bends, and is connected to the left frame 141C. The holding side arm 153B extends from the end portion of the holding rear arm 152B on the side near the right frame 141D toward the front frame 141A, bends and is connected to the right frame 141D.

It is noted that the holding arm 150 is not limited to having the above-described configuration. For example, the holding arm 150 may be connected to the left end portion 131C and the right end portion 131D of the base portion 130. In addition, the holding arm 150 may be connected to the front frame 141A of the holding portion 140.

(Multilayer Structure)

Figure 4:
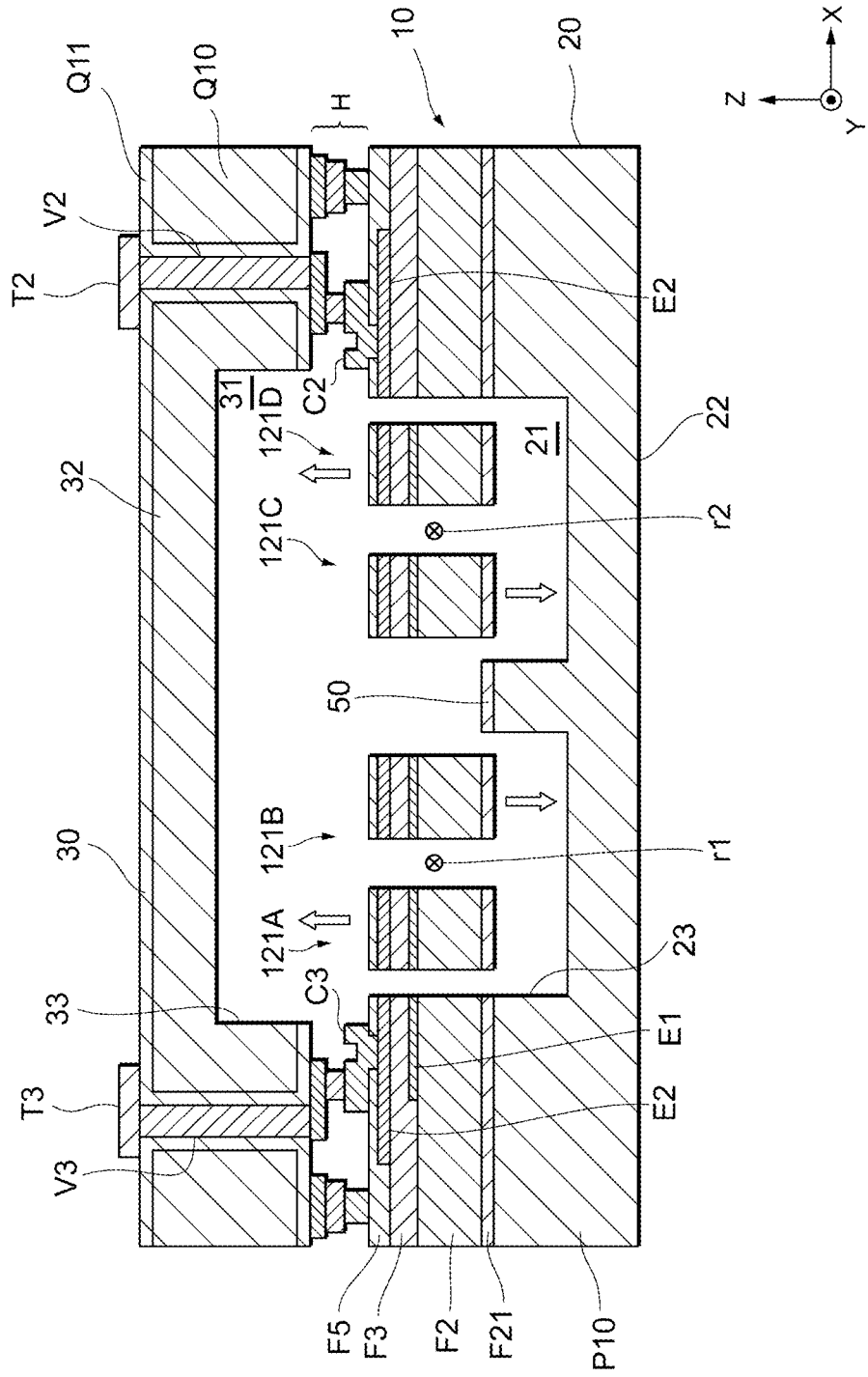
FIG. 4 is a sectional view taken along an X axis conceptually illustrating the multilayer structure of the resonance device illustrated in FIG. 1.
Figure 5:
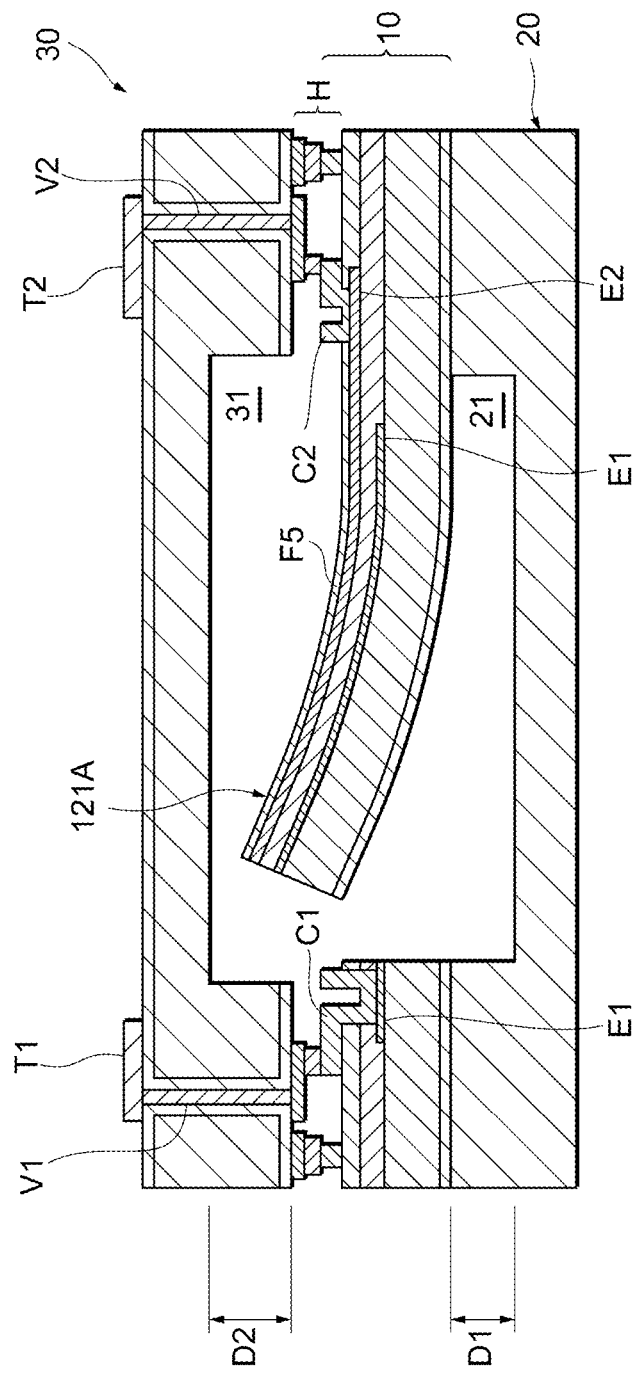
FIG. 5 is a sectional view taken along a Y axis conceptually illustrating the multilayer structure of the resonance device illustrated in FIG. 1 during operation.

Next, the multilayer structure and operation of the resonance device 1 according to the first embodiment will be described while referring to FIGS. 4 and 5. FIG. 4 is a sectional view taken along the X axis conceptually illustrating the multilayer structure of the resonance device illustrated in FIG. 1. FIG. 5 is a sectional view taken along the Y axis conceptually illustrating the multilayer structure of the resonance device illustrated in FIG. 1 during operation. FIG. 4 simply schematically illustrates a cross section including the arm portions 123A to 123D, lead-out lines C2 and C3, through electrodes V2 and V3, and so forth in order to describe the multilayer structure of the resonance device 1 and these elements are not necessarily located in the same planar cross section. For example, the through electrodes V2 and V3 may be formed at positions that are spaced away in the Y-axis direction from a cross-section that is parallel to the ZX plane defined by the Z-axis and the X-axis and cuts through the arm portions 123A to 123D. Similarly, FIG. 5 simply schematically illustrates a cross section including the vibrating arm 121A, lead-out lines C1 and C2, through electrodes V1 and V2, and so forth in order to describe the multilayer structure of the resonance device 1 and these elements are not necessarily located in the same planar cross section.

In the resonance device 1, the holding portion 140 of the resonator 10 is bonded to the top of the side wall 23 of the bottom cover 20 and furthermore, the holding portion 140 of the resonator 10 and the side wall 33 of the top cover 30 are bonded to each other. Thus, the resonator 10 is held between the bottom cover 20 and the top cover 30 and a vibration space in which the vibrating portion 110 vibrates is formed by the bottom cover 20, the top cover 30, and the holding portion 140 of the resonator 10. In an exemplary aspect, the resonator 10, the bottom cover 20, and the top cover 30 are each formed using a silicon (Si) substrate (hereafter, "Si substrate"), for example. Moreover, the resonator 10, the bottom cover 20, and the top cover 30 may be each formed of a silicon on insulator (SOI) substrate in which a silicon layer and a silicon oxide film are stacked one on top of the other.

(Resonator 10)

The vibrating portion 110, the holding portion 140, and the holding arm 150 of the resonator 10 are integrally formed with each other using the same process. A metal film E1 is stacked on a Si substrate F2, which is an example of a substrate, in the resonator 10. A piezoelectric film F3 is stacked on the metal film E1 so as to cover the metal film E1 and a metal film E2 is stacked on the piezoelectric film F3. A protective film F5 is stacked on the metal film E2 so as to cover the metal film E2. The above-described mass-adding films may be additionally stacked on the protective film F5 in the tip portions 122A to 122D. The vibrating portion 110, the holding portion 140, and the holding arm 150 are formed by subjecting a multilayer body consisting of the above-described Si substrate F2, the metal film E1, the piezoelectric film F3, the metal film E2, the protective film F5, and so on to removal processing and patterning. In the removal processing, for example, the multilayer body is dry etched by radiating an argon (Ar) ion beam. The front surface and the side surface of the resonator 10 where ion etching has been performed are charged with the same polarity as a result of being exposed to the charged particles.

The Si substrate F2 is formed from a degenerate n-type silicon (Si) semiconductor having a thickness of around 6 µm, for example, and can contain phosphorus (P), arsenic (As), antimony (Sb), and the like as n-type dopants. The resistance of the degenerate silicon (Si) used in the Si substrate F2 is, for example, less than 16 mΩ·cm and more preferably is less than or equal to 1.2 mΩ·cm. In addition, a temperature characteristic correcting layer F21 composed of a silicon oxide such as SiO2 is formed on the bottom surface of the Si substrate F2. Changes in the resonant frequency of the resonator 10 that occur with changes in the environmental temperature can be reduced as a result of the vibrating portion 110 having the temperature characteristic correcting layer F21. A temperature characteristic correcting layer may be formed on the top surface of the Si substrate F2 or may be formed on both the top surface and the bottom surface of the Si substrate F2.

The temperature characteristic correcting layer F21 of the tip portions 122A to 122D is preferably formed with a uniform thickness. A "uniform thickness" means that thickness variations of the temperature characteristic correcting layer F21 lie within ±20% of the average value of the thickness.

The metal films E1 and E2 each include an excitation electrode for exciting the vibrating arms 121A to 121D and a lead-out electrode for electrically connecting the excitation electrode to an external power source or ground potential. As further shown, the parts of the metal films E1 and E2 that function as excitation electrodes face each other with the piezoelectric film F3 interposed therebetween in the arm portions 123A to 123D of the vibrating arms 121A to 121D. The parts of the metal films E1 and E2 that function as lead-out electrodes are, for example, led out to the holding portion 140 from the base portion 130 via the holding arm 150. The metal film E1 is electrically continuous throughout the entire resonator 10. The parts of the metal film E2 formed in the outer vibrating arms 121A and 121D and the parts of the metal film E2 formed in the inner vibrating arms 121B and 121C are electrically isolated from each other. The metal film E1 corresponds to a lower electrode and the metal film E2 corresponds to an upper electrode.

In an exemplary aspect, the thicknesses of the metal films E1 and E2, for example, lie in a range of around 0.1 to 0.2 µm. The metal films E1 and E2 are patterned into excitation electrodes, lead-out electrodes, and so on by performing a removal process such as etching after film deposition. The metal films E1 and E2 are, for example, formed of a metal material having a body-centered cubic crystal structure. Specifically, the metal films E1 and E2 are formed using molybdenum (Mo), tungsten (W), or the like.

The piezoelectric film F3 is a thin film formed of a type of piezoelectric material that converts electrical energy into mechanical energy and vice versa. The piezoelectric film F3 expands and contracts in Y-axis directions among in-plane directions of the XY plane in accordance with an electric field formed in the piezoelectric film F3 by the metal films E1 and E2. The open ends of the vibrating arms 121A to 121D are displaced toward the inner surfaces of the bottom cover 20 and the top cover 30 by the expansion and contraction of the piezoelectric film F3 and the vibrating arms 121A to 121D vibrate in an out-of-plane bending vibration mode.

Moreover, the piezoelectric film F3 is formed of a material having a wurtzite-type hexagonal crystal structure and, for example, can have a nitride or an oxide as a main constituent such as aluminum nitride (AlN), scandium aluminum nitride (ScAlN), zinc oxide (ZnO), gallium nitride (GaN), or indium nitride (InN). Scandium aluminum nitride is a substance obtained by replacing some of the aluminum in aluminum nitride with scandium, and instead of scandium, the aluminum may be replaced with two elements such as magnesium (Mg) and niobium (Nb) or magnesium (Mg) and zirconium (Zr). The thickness of the piezoelectric film F3 is, for example, around 1 µm, but may be around 0.2 to 2 µm.

The protective film F5 protects the metal film E2 from oxidation. It is noted that the protective film F5 does not need to be exposed to the bottom plate 32 of the top cover 30 as long as the protective film F5 is provided on the top cover 30 side of the metal film E2. For example, a film that covers the protective film F5 may be formed such as a parasitic capacitance reducing film that reduces the capacitance of a wiring line formed in the resonator 10. The protective film F5 is, for example, formed of a nitride film such as an aluminum nitride (AlN) or silicon nitride ($SiN_x$) film or an oxide film such as an alumina oxide ($Al2O_3$), tantalum pentoxide ($Ta_2O_5$), or silicon oxide ($SiO_x$) film.

The parts of the protective film F5 provided on the tip portions 122A to 122D may be trimmed using an argon ion beam, for example, in order to adjust the resonant frequency. In this trimming process, the front surface and side surface of the resonator 10 are charged with the same polarity as a result of being exposed to the charged particles. When a mass-adding film is additionally provided on the protective film F5 on the tip portions 122A to 122D, the mass-adding film is preferably formed of a material that is easier to trim than the protective film F5 from the viewpoint of efficiency when the mass-adding film is used as a frequency-adjusting film and the mass-adding film may be a molybdenum (Mo) film, for example.

Lead-out lines C1, C2, and C3 are formed on the protective film F5 of the holding portion 140. The lead-out line C1 is electrically connected to the metal film E1 via a through hole formed in the piezoelectric film F3 and the protective film F5. The lead-out line C2 is electrically connected to parts of the metal film E2 formed on the outer vibrating arms 121A and 121D via through holes formed in the protective film F5. The lead-out line C3 is electrically connected to parts of the metal film E2 formed on the inner vibrating arms 121B and 121C via through holes formed in the protective film F5. The lead-out lines C1 to C3 are formed of a metal material such as aluminum (Al), germanium (Ge), gold (Au), or tin (Sn).

(Bottom Cover 20)

In an exemplary aspect, the bottom plate 22 and the side wall 23 of the bottom cover 20 are integrally formed using a Si substrate P10. The Si substrate P10 is formed of non-degenerate silicon and has a resistivity greater than or equal to 10 Ω·cm, for example. Moreover, the Si substrate P10 is exposed inside the recess 21 of the bottom cover 20. The temperature characteristic correcting layer F21 is formed on the top surface of the protrusion 50. However, from the viewpoint of suppressing charging of the protrusion 50, the Si substrate P10, which has a lower electrical resistivity than the temperature characteristic correcting layer F21, may be exposed at the top surface of the protrusion 50 or a conductive layer may be formed. A getter layer may be formed on the surface of the recess 21 of the bottom cover 20 on the side that faces the resonator 10.

The thickness of the bottom cover 20 defined in the Z-axis direction is around 150 µm and a depth D1 of the recess 21, which is defined in the same way, is around 100 µm. The amplitude of the vibrating arms 121A to 121D is restricted by the depth D1 and therefore the maximum amplitude on the side near the bottom cover 20 is around 100 μm.

It is noted that the bottom cover 20 can also be regarded as part of a SOI substrate. If the resonator 10 and the cover lid 20 are regarded as a MEMS substrate formed by an integrated SOI substrate, the Si substrate P10 of the bottom cover 20 corresponds to a support substrate of the SOI substrate, the temperature characteristic correcting layer F21 of the resonator 10 corresponds to a box layer of the SOI substrate, and the Si substrate F2 of the resonator 10 corresponds to an active layer of the SOI substrate. At this time, various semiconductor elements and circuits may be formed using portions of a MEMS substrate that continue outside the resonance device 1.

(Top Cover 30)

The bottom plate 32 and the side wall 33 of the top cover 30 are integrally formed using a Si substrate Q10. It is preferable that the front surface and the rear surface of the top cover 30 and the inner surfaces of the through holes in the top cover 30 be covered by a silicon oxide film Q11. The silicon oxide film Q11 is formed on the front surface of the Si substrate Q10 by oxidizing the Si substrate Q10 or by performing chemical vapor deposition (CVD), for example. The Si substrate Q10 is exposed inside the recess 31 of the top cover 30. A getter layer may be formed on the surface of the recess 31, which is on the side facing the resonator 10, of the top cover 30. The getter layer is, for example, formed of a material having a strong affinity for oxygen such as titanium (Ti), and adsorbs outgas released from a bonding part H and suppresses reduction of the vacuum in the vibration space.

The thickness of the top cover 30 defined in the Z-axis direction is around 150 μm and a depth D2 of the recess 31, which is defined in the same way, is around 100 μm. The amplitude of the vibrating arms 121A to 121D is restricted by the depth D2 and therefore the maximum amplitude on the side near the top cover 30 is around 100 μm.

As further shown, terminals T1, T2, and T3 are formed on the top surface of the top cover 30 (i.e., the surface on the opposite side from the surface facing resonator 10). The terminal T1 is a mounting terminal for grounding the metal film E1. The terminal T2 is a mounting terminal that electrically connects the metal film E2 of the outer vibrating arms 121A and 121D to an external power supply. The terminal T3 is a mounting terminal that electrically connects the metal film E2 of the inner vibrating arms 121B and 121C to an external power supply. The terminals T1 to T3 are formed by plating nickel (Ni), gold (Au), silver (Ag), copper (Cu), or the like on a metallized layer (underlying layer) of chromium (Cr), tungsten (W), nickel (Ni), or the like. Dummy terminals, which are electrically insulated from the resonator 10, may be formed on the top surface of the top cover 30 for the purpose of adjusting parasitic capacitances and mechanical strength balance.

Through electrodes V1, V2, and V3 are formed inside the side wall 33 of the top cover 30. The through electrode V1 electrically connects the terminal T1 and the lead-out line C1 to each other, the through electrode V2 electrically connects the terminal T2 and the lead-out line C2 to each other, and the through electrode V3 electrically connects the terminal T3 and the lead-out line C3 to each other. The through electrodes V1 to V3 are formed by filling through holes, which penetrate through the side wall 33 of the top cover 30 in the Z-axis direction, with an electrically conductive material. The filled electrically conductive material is, for example, polycrystaline silicon (poly-Si), copper (Cu), gold (Au), or the like.

In the exemplary aspect, the bonding part H is formed between the side wall 33 of the top cover 30 and the holding portion 140 in order to bond the side wall 33 of the top cover 30 and the holding portion 140 of the resonator 10 to each other.

The bonding part H is formed in a closed ring shape that surrounds the vibrating portion 110 in the XY plane so as to hermetically seal the vibration space of the resonator 10 in a vacuum state. The bonding part H is formed of eutectically bonded metal films, for example, an aluminum (Al) film, a germanium (Ge) film, and an aluminum (Al) film, stacked in this order. The bonding part H may be formed of a combination of films appropriately selected from among gold (Au), tin (Sn), copper (Cu), titanium (Ti), silicon (Si), and the like. In addition, a metallic compound such as titanium nitride (TiN) or tantalum nitride (TaN) may be sandwiched in the bonding part H in order to improve adhesion.

(Operation)

In this embodiment, the terminal T1 is grounded and alternating current voltages of opposite phases are applied to the terminal T2 and the terminal T3. Therefore, the phase of the electric field formed in the piezoelectric film F3 in the outer vibrating arms 121A and 121D and the phase of the electric field formed in the piezoelectric film F3 in the inner vibrating arms 121B and 121C are in opposite phases during operation. This causes the outer vibrating arms 121A and 121D and the inner vibrating arms 121B and 121C to vibrate with opposite phases from each other. For example, when the tip portions 122A and 122D of the outer vibrating arms 121A and 121D are displaced toward the inner surface of the top cover 30, the tip portions 122B and 122C of the inner vibrating arms 121B and 121C are displaced toward the inner surface of the bottom cover 20. As described above, the vibrating arm 121A and the vibrating arm 121B, which are adjacent to each other, vibrate in opposite vertical directions around a center axis r1 that extends in the Y-axis direction between the vibrating arm 121A and the vibrating arm 121B. In addition, the vibrating arm 121C and the vibrating arm 121D, which are adjacent to each other, vibrate in opposite vertical directions around a center axis r2 that extends in the Y-axis direction between the vibrating arm 121C and the vibrating arm 121D. This creates torsional moments in opposite directions at the center axes r1 and r2 and bending vibration is generated in the base portion 130. In an exemplary aspect, the maximum amplitude of the vibrating arms 121A to 121D is around 100 μm and the amplitude during normal driving is around 10 μm.

(Release Width)

Next, a release width around the peripheries of the excitation portion 120 and the holding arm 150 will be described while referring to FIG. 3. Since the resonator 10 is configured to have planar symmetry with respect to the virtual plane P, the release width around the peripheries of the outer vibrating arm 121A, the inner vibrating arm 121B, and the left holding arm 151A will be described and description of the release width around the peripheries of the outer vibrating arm 121D, the inner vibrating arm 121C, and the right holding arm 151B will be omitted.

As an example, a release width 12Wa between the tip portion 122A of the outer vibrating arm 121A and the left frame 141C of the holding portion 140 has substantially the same size as a release width 12Wb between the tip portion 122A of the outer vibrating arm 121A and the front frame 141A of the holding portion 140. In addition, the release width 12Wa is substantially the same size as a release width 12Wc between the tip portion 122A of the outer vibrating arm 121A and the tip portion 122B of the inner vibrating arm 121B (12Wa=12Wb=12Wc). Moreover, although not illustrated, the release width between the tip portion 122B of the inner vibrating arm 121B and the front frame 141A of the holding portion 140 has substantially the same size as the release width 12Wb.

As an example, a release width 15Wa between the holding side arm 153A of the left holding arm 151A and the left frame 141C of the holding portion 140 has substantially the same size as a release width 15Wb between the holding side arm 153A of the left holding arm 151A and the arm portion 123A of the outer vibrating arm 121A. A release width 15Wc between the holding rear arm 152A of the left holding arm 151A and the rear end portion 131B of the base portion 130 has substantially the same size as a release width 15Wd between the holding rear arm 152A of the left holding arm 151A and the rear frame 141B of the holding portion 140. The release widths 15Wa to 15Wd have substantially the same size as each other (15Wa=15Wb=15Wc=15Wd). A release width 13W between the rear end portion 131B of the base portion 130 and the rear frame 141B of the holding portion 140 has substantially the same size as the release widths 15Wa to 15Wd around the periphery of the left holding arm 151A.

The release width around the periphery of the tip portion 122A of the outer vibrating arm 121A is not limited to the example described above and the release width 12Wb may have a different size from the release width 12Wa and the release width 12Wc may have a different size from the release width 12Wa. The release width around the periphery of the left holding arm 151A is also not limited to the example described above and the release width 15Wa may be different from the release width 15Wb and the release width 15Wc may be different from the release width 15Wd. At least two out of the release widths 15Wa to 15Wd may have substantially different sizes from each other.

The release widths 12Wa to 12Wc are larger than the release widths 15Wa and 15Wb and larger than the release widths 15Wc and 15Wd. However, it is sufficient that the release widths 12Wa to 12Wc be larger than the release width 15Wa or 15Wb and larger than the release width 15Wc or 15Wd.

In addition, the release widths 12Wa to 12Wc are larger than the release width 13W.

As described above, in this embodiment, the release widths 12Wa and 12Wb between the vibrating arms 121A and 121B and the holding portion 140 are larger than release widths 14Wa to 14Wd around the periphery of the left holding arm 151A. This configuration spaces the tip portions 122A and 122B of the vibrating arms 121A and 121B away from the holding portion 140 and increases the size of the base portion 130 and the holding arm 150.

Insulators and conductors on the surfaces or between the layers of the vibrating arms 121A to 121D, the base portion 130, the holding portion 140, and the holding arm 150 are charged due to ion beam exposure in the etching and trimming processes, a pyroelectric effect due to temperature changes in the manufacturing process and operating environment, and so forth. As a result, the vibrating arms 121A to 121D exert the effect of the Coulomb force on each other and may be affected by the Coulomb force from the holding portion 140. The tip portions 122A to 122D of the vibrating arms 121A to 121D are the parts of the vibrating arms 121A to 121D that are most easily displaced and have the largest range of motion and therefore the tip portions 122A to 122D are readily affected by the Coulomb force. Therefore, changes in the vibration paths of the vibrating arms caused by Coulomb repulsion or attraction caused by charging of the resonator 10 can be suppressed and variations in the resonant frequency can be suppressed by setting a large release width around the peripheries of the tip portions 122A to 122D of the vibrating arms 121A to 121D and spacing the tip portions 122A to 122D of the vibrating arms 121A to 121D away from the holding portion 140.

When the resonator 10 is reduced in size, if the base portion 130 is large, degradation of the driving voltage dependence (DLD) of the frequency is suppressed. In addition, if the base portion 130 and the holding arm 150 are large, the increase of a parasitic capacitance and degradation of isolation can be suppressed. In other words, it is possible to reduce factors that inhibit size reduction of the resonator 10 by setting the release width around the peripheries of the base portion 130 and the holding arm 150 to be smaller and making the base portion 130 and the holding arm 150 larger.

Since the release width 12Wc is the same size as the release width 12Wa, the effect of the Coulomb force received from the left frame 141C of the holding portion 140 and the effect of the Coulomb force received from the tip portion 122B of the inner vibrating arm 121B are canceled out at the tip portion 122A of the outer vibrating arm 121A. Therefore, variations in the vibration path of the outer vibrating arm 121A can be suppressed. The same applies to the other vibrating arms 121B and 121C.

Hereafter, the configuration of a resonator according to another embodiment of the present invention will be described. In the following embodiment, description of matters common to the first embodiment is omitted and only the differences are described. In particular, the same operational effects resulting from the same configurations will not be repeatedly described.

Second Exemplary Embodiment

Figure 6:
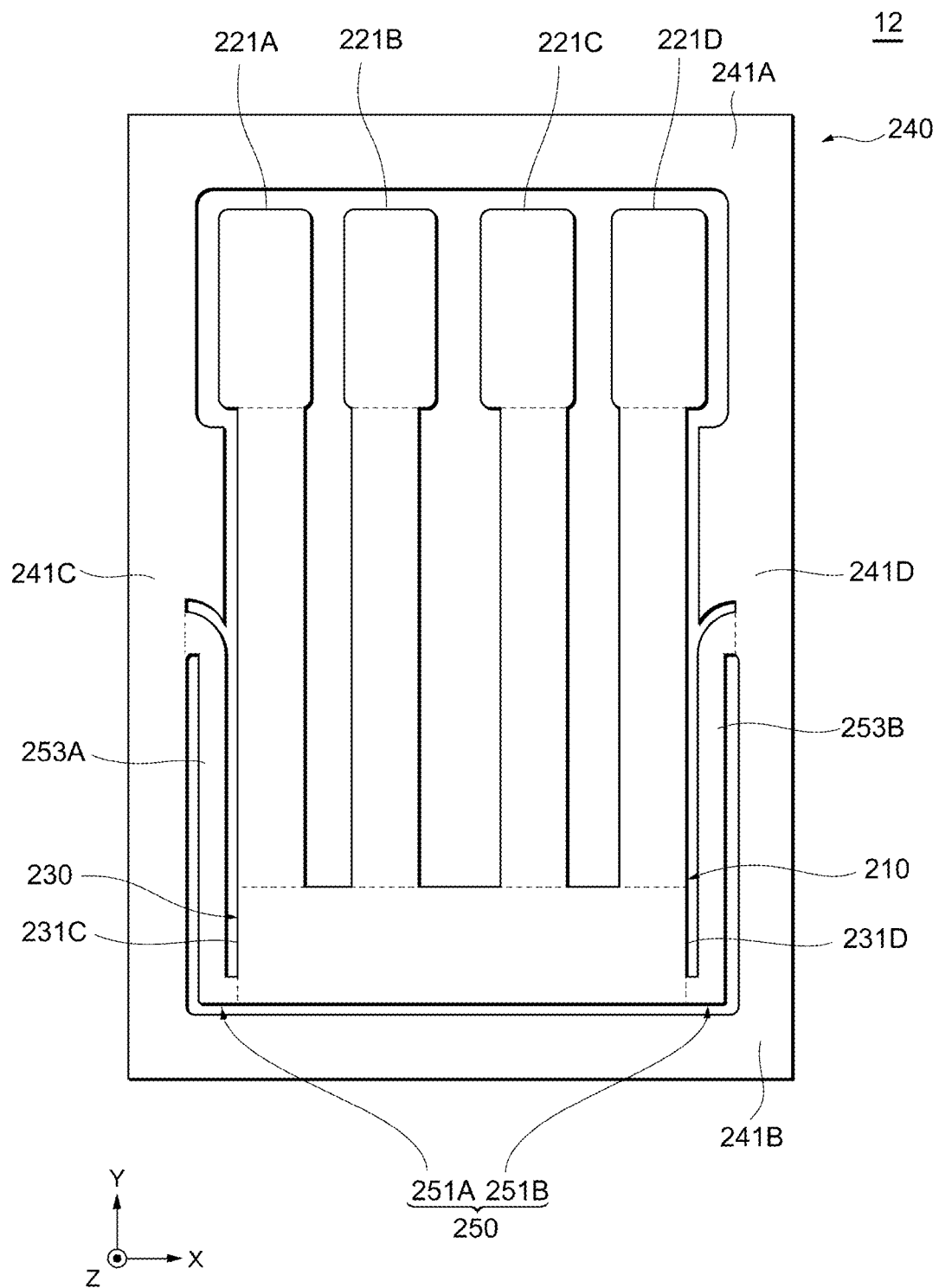
FIG. 6 is a plan view schematically illustrating the structure of a resonator according to a second exemplary embodiment of the present invention.

Next, a resonator 12 according to a second embodiment will be described while referring to FIG. 6. FIG. 6 is a plan view schematically illustrating the structure of the resonator according to the second embodiment. Similar to the resonator 10 according to the first embodiment, the resonator 12 according to the second embodiment includes a vibrating portion 210, a holding portion 240 (or frame), and a holding arm 250. The vibrating portion 210 includes a base portion 230 (or base) and vibrating arms 221A to 221D, the holding portion 240 includes a front frame 241A, a rear frame 241B, a left frame 241C, and a right frame 241D, and the holding arm 250 includes a left holding arm 251A and a right holding arm 251B.

The second embodiment differs from the first embodiment is that the left holding arm 251A extends from a left end portion 231C of the base portion 230 and the right holding arm 251B extends from a right end portion 231D of the base portion 230. Specifically, the left holding arm 251A and the right holding arm 251B respectively include holding side arms 253A and 253B. The holding side arm 253A extends from the left end portion 231C toward the left frame 241C, bends, extends toward the front frame 241A, bends again, and is connected to the left frame 241C. The right holding arm 251B extends from the right end portion 231D, bends, extends toward the front frame 241A, bends again, and is connected to the right frame 241D. The same effect can be obtained with this embodiment as with the first embodiment.

Hereafter, some or all of the exemplary embodiments are described herein. However, it is noted that the present invention is not limited to the following configurations and variations can be provided within the spirit of the invention.

As described above, an exemplary aspect of the present invention provides a resonator that includes a base; at least three vibrating arms that include a piezoelectric film, an upper electrode and a lower electrode provided so as to face each other with the piezoelectric film interposed therebetween, first ends of the vibrating arms being fixed ends connected to a front end of the base and second ends of the vibrating arms being open ends provided so as to be spaced away from the front end. Moreover; a frame is provided for holding the base; and a holding arm connect the base portion and the holding portion to each other. Each vibrating arm includes an arm portion that extends from the front end of the base and a tip that is connected to the arm portion. The holding arm includes a holding side arm that extends parallel to an outer vibrating arm, which is arranged on the outside among the at least three vibrating arms, between the outer vibrating arm and the frame. A release width between the tip of the outer vibrating arm and the frame is larger than a release width between the holding side arm and the frame or a release width between the arm portion of the outer vibrating arm and the holding side arm.

Thus, the tips of the vibrating arms are spaced away from the frame and the sizes of the base and the holding arm can be increased by setting the release width around the periphery of the tips of the vibrating arms to be large. Changes in the vibration paths of the vibrating arms caused by Coulomb repulsion or attraction caused by charging of the resonator can be suppressed and variations in the resonant frequency are suppressed by spacing the tips of the vibrating arms away from the frame. When the resonator is reduced in size, if the base is large, degradation of the driving voltage dependence (DLD) of the frequency can be suppressed. In addition, if the base portion and the holding arm are large, increasing of a parasitic capacitance and degradation of isolation can be suppressed. It is possible to reduce factors that inhibit size reduction of the resonator by setting the release width around the peripheries of the base and the holding arm to be smaller and making the base and the holding arm larger.

As an exemplary aspect, the tips are mass-loaded portions and the mass-loaded portions have a larger width than the arm portions. Thus, since the tips of the vibrating arms are heavier, the vibrating arms can be made shorter and the resonator can be reduced in size.

As an exemplary aspect, a release width between the mass-loaded portion of the outer vibrating arm and the mass-loaded portion of an inner vibrating arm positioned adjacent to the outer vibrating arm is the same size as the release width between the mass-loaded portion of the outer vibrating arm and the frame. Thus, the effect of a Coulomb force received from a left frame of the frame and the effect of a Coulomb force received from the tip of the inner vibrating arm are canceled out at the tip of the outer vibrating arm. Therefore, variations in the vibration path of the outer vibrating arm can be suppressed.

As an exemplary aspect, the holding arm further includes a holding rear arm that extends from a rear end of the base between the base and the frame, and a release width between the tip of the outer vibrating arm and the frame is larger a release width between the holding rear arm and the base or a release width between the holding rear arm and the frame. This configuration enables vibration leakage from the vibrating portion to the frame to be reduced compared with a resonator having a configuration in which holding arms extend from a left end portion and a right end portion of the base.

As an exemplary aspect, a resonance device is provided that includes: any of the above-described resonators; a bottom cover that is bonded to the resonator; and a top cover that is bonded to the bottom cover with the resonator interposed therebetween and that forms, together with the bottom cover, a vibration space in which the at least three vibrating arms vibrate.

As described above, exemplary aspects of the present invention provide a resonator that can be reduced in size while suppressing variations in the resonant frequency and also provide a resonance device including the resonator.

In general, the exemplary embodiments described above are to facilitate an understanding of the present invention and the embodiments are not to be interpreted as limiting the present invention. It is noted that the present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, the elements included in the embodiments can be combined as much as technically possible and such combined elements are also included in the scope of the present invention so long as the combined elements have the characteristics of the present invention.

REFERENCE SIGNS LIST

1 . . . resonance device
9 . . . particle
10 . . . resonator
20 . . . bottom cover
30 . . . top cover
21, 31 . . . recess
22, 32 . . . bottom plate
23, 33 . . . side wall
110 . . . vibrating portion
121A to 121D . . . vibrating arm
122A to 122D . . . tip portion
123A to 123D . . . arm portion
130 . . . base portion
131A . . . front end portion
131B . . . rear end portion
131C . . . left end portion
131D . . . right end portion
140 . . . holding portion
141A . . . front frame
141B . . . rear frame
141A . . . left frame
141B . . . right frame
150 . . . holding arm
151A . . . left holding arm
151B . . . right holding arm
152A, 152B . . . holding rear arm
153A, 153B . . . holding side arm
F2 . . . Si substrate
F21 . . . temperature characteristic correcting layer
F3 . . . piezoelectric film
F5 . . . protective film
E1 . . . metal film (lower electrode)
E2 . . . metal film (upper electrode)

The invention claimed is:

1. A resonator comprising:
   a base;
   at least three vibrating arms that include a pair of outer vibrating arms and at least one inner vibrating arm that is between the pair of outer vibrating arms in a plan view of the resonator, wherein each of the at least three vibrating arms includes a fixed end connected to a front end of the base and an open end spaced away from the front end, with each vibrating arm further including an arm portion that extends from the fixed end and a tip connected to the arm portion and opposite the fixed end;
   a frame constructed for holding the base; and
   a holding arm that connects the base to the frame and that includes a holding side arm that extends parallel to one outer vibrating arm of the pair of outer vibrating arms, such that the holding side arm extends between the outer vibrating arm and the frame in the plan view of the resonator,
   wherein a width between a side surface of the tip of the one outer vibrating arm and a side surface of the frame facing the side surface of the tip is larger than a width between a side surface of the holding side arm and the side surface of the frame or a width between a side surface of the arm portion of the one outer vibrating arm and a side surface of the holding side arm that faces the arm portion, and
   wherein a width between a side surface of the tip of the one outer vibrating arm and a side surface of the tip of the at least one inner vibrating arm that is directly next to the one outer vibrating arm and is facing the side surface of the tip is a same width as the width between the side surface of the tip of the outer vibrating arm and the side surface of the frame that is facing the side surface of the tip of the one outer vibrating arm.

2. The resonator according to claim 1, wherein each of the at least three vibrating arms include a piezoelectric film, an upper electrode and a lower electrode disposed to face each other in a thickness direction of the resonator with the piezoelectric film interposed therebetween.

3. The resonator according to claim 1, wherein the width between the side surface of the tip of the one outer vibrating arm and the side surface of the frame facing the side surface of the tip is larger than the width between the side surface of the holding side arm and the side surface of the frame.

4. The resonator according to claim 1, wherein the release width between the side surface of the tip of the one outer vibrating arm and the side surface of the frame facing the side surface of the tip is larger than the width between the side surface of the arm portion of the one outer vibrating arm and the side surface of the holding side arm.

5. The resonator according to claim 1, wherein the holding arm further includes a holding rear arm that extends from a rear end of the base between the base and the frame.

6. The resonator according to claim 5, wherein a width between a side surface of the holding rear arm and a side surface of the rear end of the base that faces the holding rear arm is a same width as the width between a side surface of the holding side arm and a side surface of the frame that faces the holding rear arm.

7. The resonator according to claim 5, wherein the release width between the side surface of the tip of the one outer vibrating arm and the side surface of the frame facing the side surface of the tip is larger than the width between the side surface of the holding rear arm and the side surface of the base or the width between the side surface of the holding rear arm and the side surface of the frame.

8. The resonator according to claim 1, wherein the respective tips of each of the at least three vibrating arms are mass-loaded that each have a larger width in the plan view of the resonator than the arm portions.

9. The resonator according to claim 1, wherein the at least three vibrating arms extending in a lengthwise direction and the respective widths are in a widthwise direction in the plan view of the resonator that is perpendicular to the lengthwise direction of the at least three vibrating arms.

10. A resonance device comprising:
    the resonator according to claim 1;
    a bottom cover that is bonded to the resonator; and
    a top cover that is bonded to the bottom cover with the resonator interposed therebetween, such that the top and bottom covers form a vibration space in which the at least three vibrating arms vibrate.

11. A resonator comprising:
    a base;
    a plurality of vibrating arms extending from the base in a lengthwise direction and including a pair of outer vibrating arms and at least one inner vibrating arm that is between the pair of outer vibrating arms in a plan view of the resonator, wherein each of the plurality of vibrating arms includes a tip opposing the base;
    a frame at least partially surround the plurality of vibrating arms; and
    a holding arm that connects the base to the frame and that includes a side arm that extends parallel to one outer vibrating arm of the pair of outer vibrating arm, such that the side arm extends between the one outer vibrating arm and the frame in the plan view of the resonator,
    wherein a first width between a side surface of the tip of the one outer vibrating arm and a side surface of the frame that is facing the side surface of the tip of the one outer vibrating arm is larger than a second width between a side surface of the side arm and the side surface of the frame or is larger than a third width between the side surface of the one outer vibrating arm and a side surface of the side arm that faces the side surface of the one outer vibrating arm,
    wherein the first, second and third widths are relative to a widthwise direction that extends perpendicular to the lengthwise direction, and
    wherein a fourth width between a side surface the tip of the one outer vibrating arm and a side surface of the tip of the at least one inner vibrating arm that is directly next to the one outer vibrating arm is a same width as the first width between the side surface of the tip of the one outer vibrating arm and the side surface of the frame that is facing the side surface of the tip of the one outer vibrating arm.

12. The resonator according to claim 11, wherein each of the plurality of vibrating arms include a piezoelectric film, an upper electrode and a lower electrode disposed to face each other in a thickness direction of the resonator with the piezoelectric film interposed therebetween.

13. The resonator according to claim 11, wherein the first width is larger than the second width.

14. The resonator according to claim 11, is larger than the third width.

15. The resonator according to claim 11, wherein the holding arm further includes a rear arm that extends from a rear end of the base between the base and the frame.

16. The resonator according to claim 15, wherein a fifth width between a side surface of the rear arm and a side surface of the rear end of the base that faces the rear arm is a same width as the second width.

17. The resonator according to claim 15, wherein the first width is larger than the fifth width or a sixth width between the side surface of the rear arm and a side surface of the frame that faces the rear arm.

18. The resonator according to claim 11, wherein the respective tips of each of the plurality of vibrating arms are mass-loaded that each have a larger width in the plan view of the resonator than remaining portions of the respective vibrating arms.

\* \* \* \* \*